United States Patent [19]

Doty, II et al.

[11] Patent Number: 5,066,868
[45] Date of Patent: Nov. 19, 1991

[54] APPARATUS FOR GENERATING PHASE SHIFTED CLOCK SIGNALS

[75] Inventors: James H. Doty, II; David L. Albean; Harold Blatter, all of Indianapolis, Ind.

[73] Assignee: Thomson Consumer Electronics, Inc., Indianapolis, Ind.

[21] Appl. No.: 566,182

[22] Filed: Aug. 13, 1990

[51] Int. Cl.$^5$ .................... H03K 5/00; H03K 19/20; H03K 5/159; H03K 5/13

[52] U.S. Cl. .................... 307/262; 307/269; 307/452; 307/594; 307/605; 328/55; 328/155; 328/61

[58] Field of Search ............. 307/262, 269, 451, 452, 307/585, 594, 605; 328/55, 155, 61

[56] References Cited

U.S. PATENT DOCUMENTS

| | | | |
|---|---|---|---|
| 4,489,342 | 12/1984 | Gollinger et al. | 358/17 |
| 4,596,939 | 6/1986 | Yamada | 307/605 |
| 4,675,612 | 6/1987 | Adams et al. | 328/63 |
| 4,682,048 | 7/1987 | Ishimoto | 307/605 |
| 4,713,621 | 12/1987 | Nakamura et al. | 328/55 |
| 4,814,879 | 3/1989 | McNeely | 358/148 |
| 4,970,507 | 11/1990 | Cooperman et al. | 307/511 |

*Primary Examiner*—Stanley D. Miller
*Assistant Examiner*—Trong Phan
*Attorney, Agent, or Firm*—Joseph S. Tripoli; Eric P. Herrmann; Ronald H. Kurdyla

[57] ABSTRACT

Clock phase shifting circuitry includes a cascade connection of inverting amplifiers for generating a plurality of relatively delayed clock signals. Buffer amplifiers couple alternate ones of the inverting amplifiers to a clock phase selection circuit for providing a desired one of said plurality of delayed clock signals. A capacitor is coupled between the output of each inverting amplifier and a point of constant potential. Respective circuits, having an input impedance which emulates the input impedance of the buffer amplifiers, are coupled to the output connections of the inverting amplifiers located between said alternate inverting amplifiers.

5 Claims, 4 Drawing Sheets

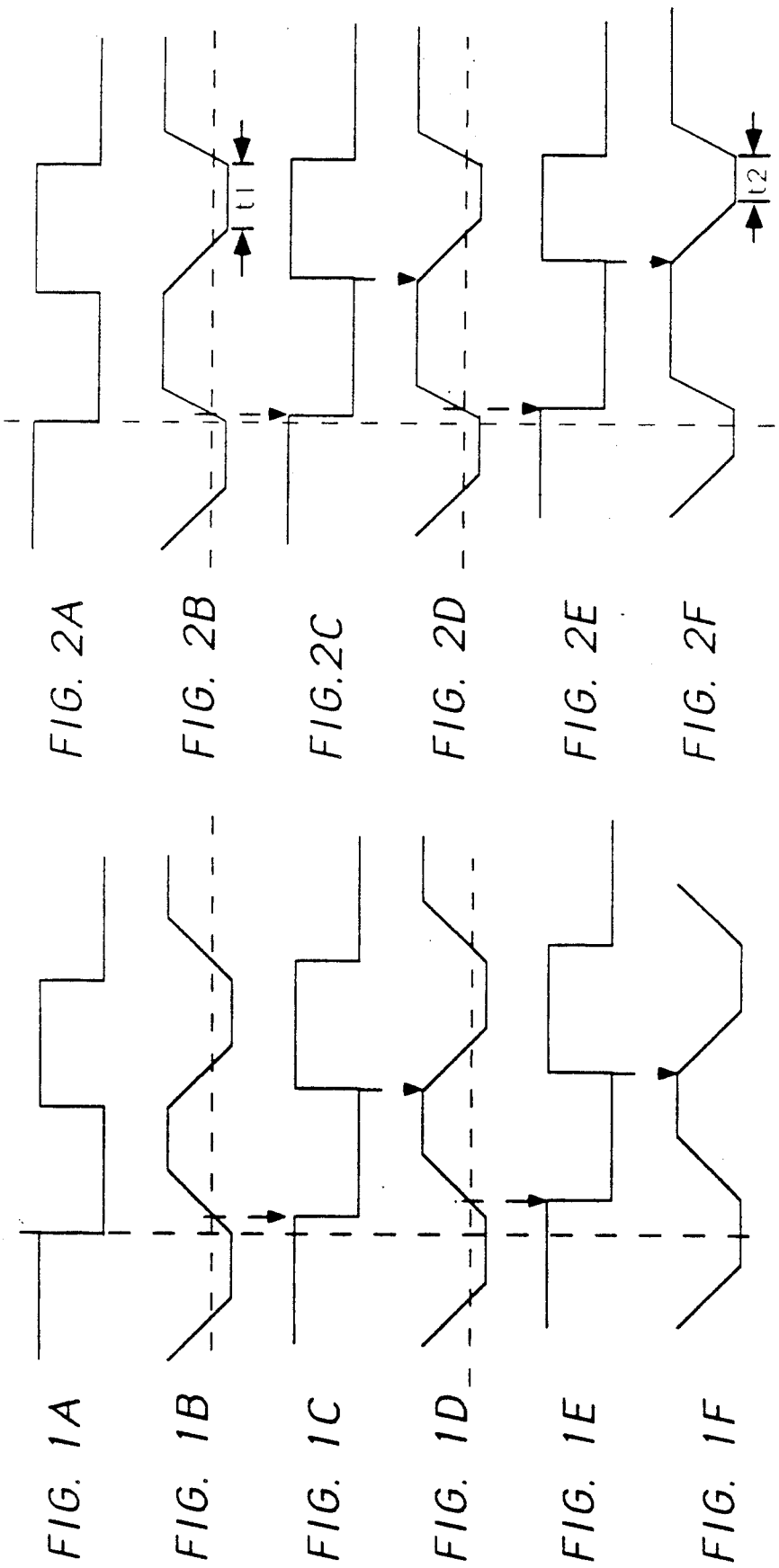

APPARATUS FOR GENERATING PHASE SHIFTED CLOCK SIGNALS

This invention relates to circuitry for generating a plurality of clock signals with successively increasing phase shifts or delay.

BACKGROUND OF THE INVENTION

Frequently, at least in the video signal processing arts, it is desired to generate a clock signal which is phase aligned to some reference signal. The approach that is typically implemented is to apply a master clock signal to a cascade arrangement of inverting amplifier. The output of each amplifer is delayed relative to the clock signal applied to its input connection due to the inherent processing delay of the amplifier. Thus the cascade connection provides, at respective amplifier connections, a plurality of clock signals each of which has a different phase delay relative to the original master clock signal. The respective clock signals are coupled in parallel to a multiplexing circuit which is conditioned by control circuitry to select a desired one of the clock signals. FIG. 5 shows such a circuit arrangement and is representative of apparatus disclosed in U.S. Pat. Nos. 4,498,342 and 4,814,879. The number of inverting amplifiers in the cascade arrangement is a function of the desired phase resolution. Consider for example that the master clock period is 70ns, and that the inherent delay of each inverting amplifier is one nanosecond. To provide clock signals with two nanosecond phase differences over one clock cycle requires 70 inverting amplifiers. Typically, however, a more coarse phase resolution is all that is needed. This can be provided with fewer inverting amplifiers in the cascade arrangement by slowing the response time of ones of the amplifiers. This is achieved by capacitively loading alternate ones of the amplifiers in the cascade arrangement. For example, in FIG. 5, the first, third, fifth and all odd numbered amplifiers include a capacitor load at their respective output connections. The intermediate (even numbered amplifiers) are not capacitively loaded. The reason for this is demonstrated in FIG. 1. FIGS. 1A-1F illustrate the signal waveforms present at for example the clock input and the first five inverting amplifier output connections respectively. FIGS. 1B, 1D and 1F represent (in exaggerated form) the output waveforms at the capacitively loaded interconnections. It is seen that the integrity of the original waveform (FIG. 1A) is significantly degraded at the output connections of the capacitively loaded stage (FIG. 1B). The degraded waveforms are substantially restored to conform to the original clock waveshape by virtue of the intervening amplifiers in the cascade arrangement. Note the assumption is made that the inverting amplifiers have relatively high voltage gain.

Assume that each inverting amplifier is formed with a common emitter or common source amplifier transistor, Tn, with a current source load device, Isource, as illustrated in FIG. 6A or alternatively formed by complementary transistors, Tp and Tn, as illustrated in FIG. 6B (FIGS. 6A and 6B each illustrate exemplary circuitry of two successive stages of a cascade arrangement of inverting amplifiers.) Knowing the amplifier and load parameters one can design a system as shown in FIG. 5 which will generate symmetrical waveforms as illustrated in FIG. 1.

The waveforms of FIGS. 1A-1E correspond to signals exhibited at nodes A-E in FIG. 5. In FIGS. 1B and 1D the dashed horizontal lines are meant to indicate the threshold potentials of the successive inverting amplifier stages (i.e., the minimum potential required to condition the common source amplifier tranistor, Tn, (FIG. 6A) into conduction). At the point in time, indicated by the vertical arrow, when, for example the potential illustrated in FIG. 1B, cross the threshold potential the following inverting amplifier switches state. Since this amplifier is not capacitively loaded, it changes state relatively fast, thereby restoring the clock waveshape.

The present invertors have determined that the asymmetrical arrangement of alternately capacitively loaded and non-loaded amplifier stages creates systems problems, which problems arise from the generation of asymmetrical clock pulses, i.e., clock waveforms which do not conform to substantially 50 percent duty cycle.

The first problem that arises results from the fact that the clock waveform asymmetry is cumulative and will tend to limit the number of delay stages that may be cascaded. This may significantly complicate design predictions related to selecting the number of stages required to provide desired phase resolution over a clock period. A second problem that arises is that normally the clock phase selected as an output clock signal, changes periodically due to the phase alignment process. In addition, it is common to utilize both the output clock and its complement in a particular system. In this instance, because of the changes in duty cycle for different clock phases, the relative timing of the transitions of the output clock signal and its complement change, tending to introduce systems timing problems.

The asymmetrical clock pulses occur for the following reasons. Assume that the inverting amplifiers are designed to provide symmetrical waveforms as illustrated in FIG. 1. Nominally the design performance will be valid only over a particular range of for example environmental conditions or device fabrication parameters. If the design constraints are violated or exceeded, the system performance will change. Assume for example that the circuit operating temperature is exceeded resulting in a 50% reduction in rise time exhibited at the output connections of the inverting amplifiers. (Note that an assumed 50% change in rise time is an exaggeration, but is convenient for illustrative purposes.) Normally, parametric changes will be significantly smaller, however, since the effect is cumulative, a small parametric change will significantly alter circuit performance in a circuit having for example 12 or more stages.

Refer to FIGS. 2A-2F which illustrate the effect. These waveforms are presumed to be generated by like circuitry to that generating the waveforms of FIG. 1 except that the amplifier risetimes are reduced by 50 percent (all other parameters remaining the same). Comparing FIGS. 1C and 2C it is seen that due to the faster risetime, switching occurs earlier for the device providing the FIG. 2C waveforms, consequently the negative going transitions of the FIG. 2C waveform occurs before the corresponding negative going transition of the FIG. 1C waveform. The corresponding positive going transitions of the FIG. 1C and 2C waveforms occur at like times. The effect is the relatively negative portion of the 2C waveform is wider than the relatively negative portion of the FIG. 1C waveform, and the relatively positive portion of the FIG. 2C waveform is narrower than that of FIG. 1C. While the waveform of FIG. 1C is symmetrical, the waveform of FIG.

2C is not. As one scans down the waveforms from FIG. 2C representing the output of a second inverting amplifier in the cascade arrangement to FIG. 2F representing the output of a fifth inverting amplifier in the arrangement it is seen that the waveform becomes cumulatively more non-symmetric (compare the times t1 and t2 indicated on the drawing).

The illustrated non-symmetry may occur for a number of reasons including a temperature induced change of risetimes; a temperature induced change in threshold; if the device is fabricated on an integrated circuit using metal-oxide-semiconductor capacitors, a substrate potential induced change of capacitance; to name but a few.

SUMMARY OF THE INVENTION

The present invention substantially overcomes the aforedescribed problems and includes a cascade arrangement of inverting amplifiers for providing a plurality of phase shifted clock pulses which substantially maintain the duty cycle of the original clock pulses applied thereto. A capacitive load of like capacitance value is coupled to the output connection of each inverting amplifier in the cascade arrangement. An output tap is coupled to the output connection of every other inverting amplifier, which taps are coupled to multiplexing circuitry. A simulated load is coupled to the output connections of the intervening amplifiers, which simulated load emulates the loading attendent the output tap of said every other inverting amplifier.

BRIEF DESCRIPTION OF THE DRAWINGS

FIGS. 1A-1F, 2A-2F, 3A-3F and 4A-4F are waveform drawings useful for an understanding of the invention.

DETAILED DESCRIPTION

Figures 3A, 3B, 3C, 3D, 3E, 3F, 4A, 4B, 4C, 4D, 4E, 4F:
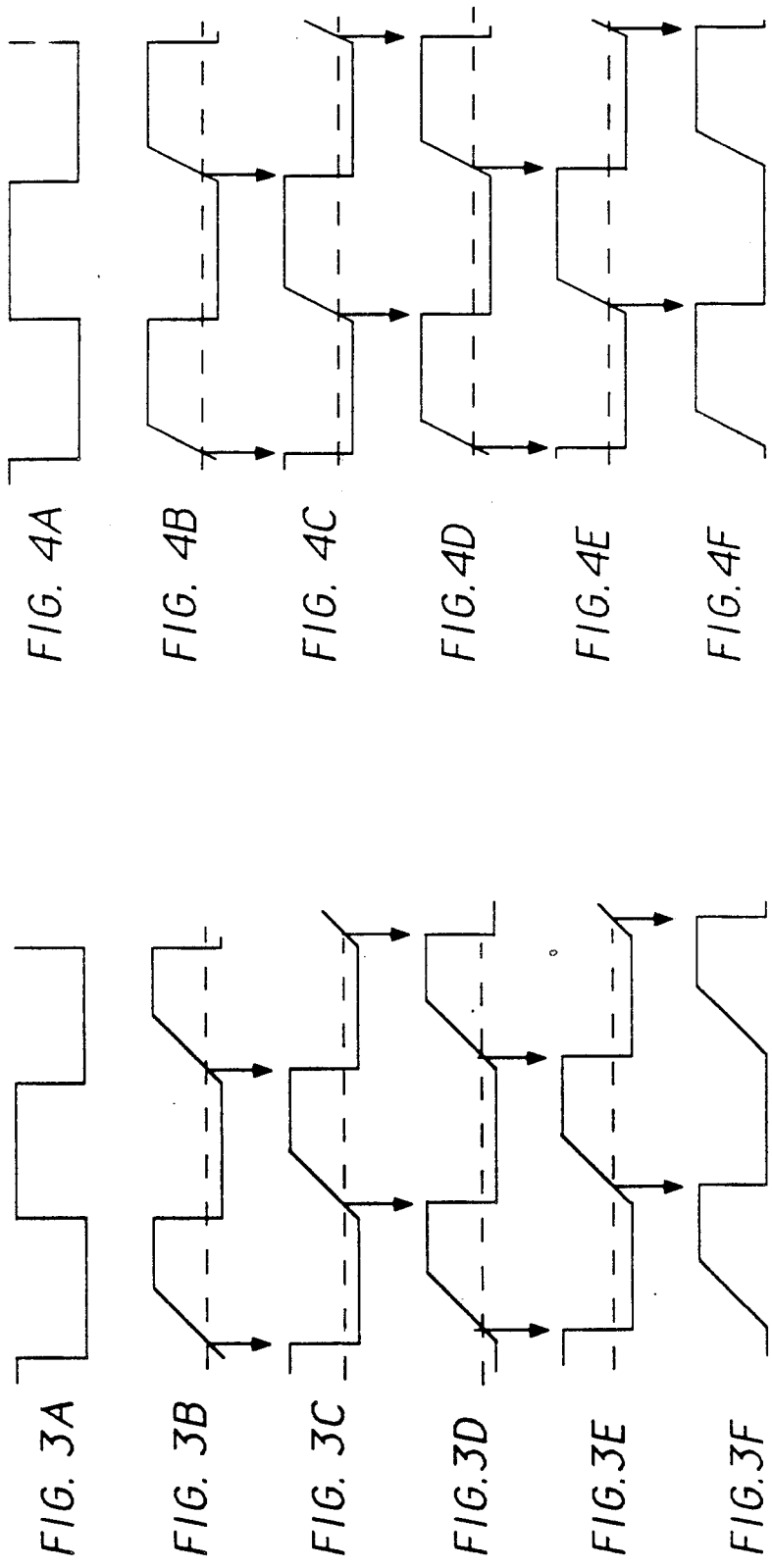
Figure 5:
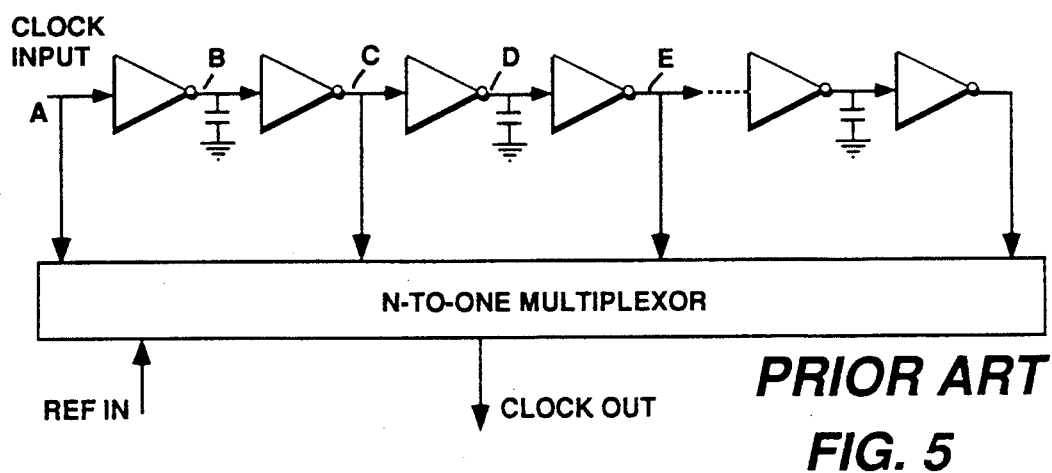
FIG. 5 is a partial block diagram of a prior art system for generating a phase shifted clock signal.
Figure 6A:
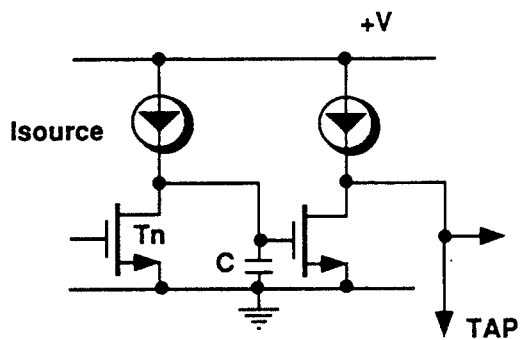
FIGS. 6A and 6B are schematic diagrams of alternative forms of inverting amplifiers which may be cascade connected to generate delayed clock signals.
Figure 7:
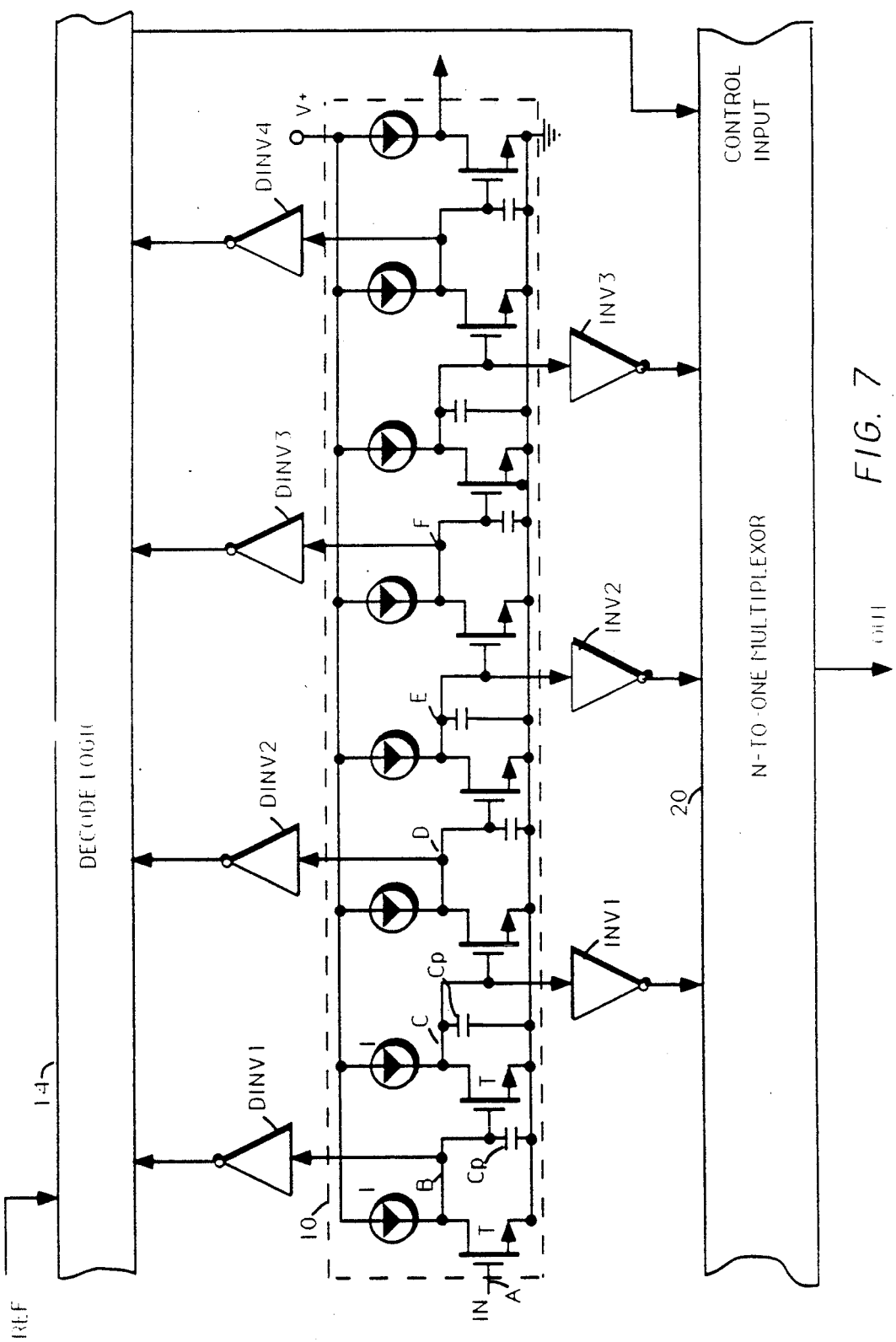
FIG. 7 is a partial block and partial schematic diagram of circuitry embodying the present invention for generating a phase shifted clock signal.

Refer to FIG. 7 which illustrates an exemplary embodiment of the invention, and to the waveforms illustrated in FIGS. 3 and 4. FIG. 7 shows a portion of a clock phase shifting apparatus including an arrangement, 10, of cascade connected inverting amplifiers of the type shown in FIG. 6A, each stage consisting of a common source transistor, T, and a current source load, I. Output signal from each stage is available at the interconnection of the transistor and the current source load. A like valued capacitance, Cp, is coupled to the output connection of each stage. Buffer amplifiers (INV1, INV2, INV3) are respectively coupled to the output connections of alternate inverting amplifiers of the cascade arrangement 10. These buffer amplifiers sharpen the respective clock phases applied thereto and apply them to an N-to-one multiplexer. Buffer amplifiers (DINV1, DINV2, DINV3) similar to the buffer amplifiers INV1, INV2, INV3 are respectively coupled to the output connections of the intervening inverting amplifiers of the cascade arrangement. As such each inverting amplifier stage of the cascade arrangement 10 is similarly loaded. Since each inverting amplifier is similarly loaded, they will exhibit similar output waveforms, for example the waveforms illustrated in FIGS. 3B-3F. (Note the waveforms 3B-3F correspond to output potentials exhibited at connections B-F respectively for the input waveform of FIG. 3A applied to connection A in FIG. 7.) The rise and fall times of the waveforms of FIGS. 3B-3F are a function of design choice, however because all of the inverting amplifiers in the cascade arrangement of FIG. 7 are similar and similarly loaded, there is far greater latitude in selecting rise and fall times than for example with a circuit like FIG. 5. The FIG. 3 waveforms correspond to desired output signals according to a set of design parameters wherein the duty cycle of the successive clock phase outputs remain substantially constant.

The waveforms of FIG. 4 correspond to respective clock phases for the circuitry of FIG. 7 wherein due to some, e.g., device parametric change, the rise times differ from design parameters by 50 percent. Form the waveforms of FIG. 4 it may be seen (FIG. 4B) that the duty cycle of the clock phase produced by the first inverting amplifier changes slightly with respect to the input waveform (FIG. 4A), however the duty cycle of the clock phases from successive stages remains constant as desired. This results from each stage having similar drive and load parameters.

Referring again to FIG. 7 the buffer amplifiers DINVi are coupled to decoding logic 14 wherein a control signal is generated indicating the one of the cascade inverting amplifier stages which exhibits a clock phase transition which is closest in time to a transition of a reference signal REF. The control signal is applied to the N-to-one multiplexer 20 to select a particular clock phase provided by the buffer amplifiers INVi. Alternatively, the output connections of the buffer amplifiers DINVi may be left unconnected and the decode/selection function performed in element 20 as illustrated for example in U.S. Pat. No. 4,814,879. In this instance the buffer amplifiers DINVi serve only to provide equal loading for the intervening inverting amplifier stages.

Consider that the buffer amplifiers INVi are similar in design to the inverting amplifier stage of FIG. 6A including a common source amplifier transistor coupled to a current source load. The input impedance of such a buffer amplifier corresponds substantially to the gate capacitance of the transistor Tn. If it can be predicated that there is little or no feedback between the output and input of such a buffer, then the buffer amplifiers DINVi may include only the transistor Tn properly biased to provide input capacitance similar to the input capacitance of the buffer amplifiers INVi. Alternatively, if the buffer amplifiers INVi can be expected to provide significant output-to-input feedback coupling, then it is necessary that the buffer amplifiers DINVi be designed similar to the amplifiers INVi.

It is also contemplated that the buffer amplifiers INVi and DINVi may not be amplifiers per se but may in fact be, for example, logic gates such as AND or OR gates, bistable devices such as flip flops, Schmitt triggers, etc. The buffer amplifiers DINVi need only include sufficient circuit elements necessary to emulate the input impedance exhibited by the buffer amplifiers INVi.

Figure 6B:
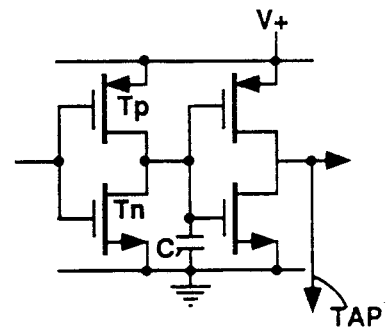

It will be appreciated by those skilled in the art of circuit design that the inverting amplifiers illustrated in FIG. 7 are exemplary and may be implemented with other inverting amplifiers such as those illustrated in FIG. 6B.

Figure 8A:
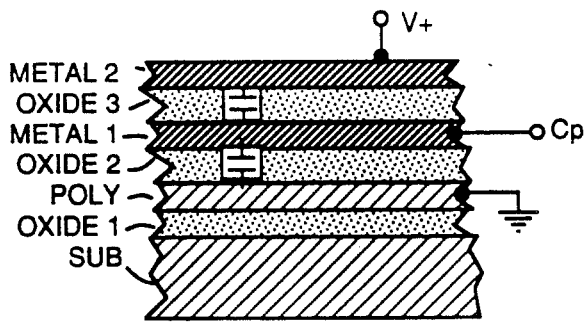
FIGS. 8A and 8B are pictorial representations of cross sections of alternative capacitor structures which may be implemented for the capacitive loads in the FIG. 7 apparatus.
Figure 8B:
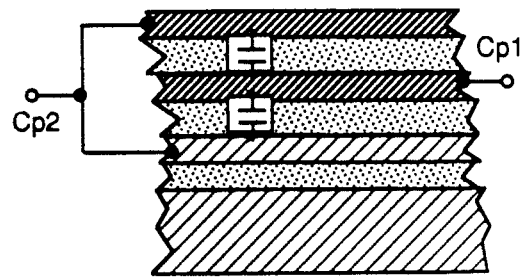

Typically, the circuitry of FIG. 7 will be realized as part of an integrated circuit. In this instance the capacitors Cp, may be advantageous realized using a sandwich structure as illustrated in FIGS. 8A and 8B. FIG. 8A is a cross section of a capacitor formed on an integrated circuit including a semiconductor substrate, SUB, over which are successively formed a first insulting layer, OXIDE 1, a polysilicon conductor, POLY, a second insulating layer, OXIDE 2, a first metallic conductor, METAL 1, a third insulating layer OXIDE 3, and a second metallic conductor, METAL 2. A capacitance exists between the METAL 1 conductor and both the METAL 2 and POLY conductors. The METAL 2 conductor is coupled to relatively supply positive potential V+ and may in fact be the V+ supply bus. The POLY conductor is coupled to ground potential and may in fact be the ground bus. The METAL 2 and POLY conductors form one plate of a capacitor and the METAL 1 conductor forms the second plate, Cp, which is coupled to the output terminal of the inverting amplifier. Note in this arrangement the capacitance value is not at all influenced by the semiconductor substrate. Further since the capacitance is formed by two parallel capacitors, it is less subject to fabrication process parameter variations. Thirdly, this design lends itself to compact circuit design since the capacitor may be formed over existing supply busses.

FIG. 8B illustrates an alternative arrangement of connecting the respective conductors to form an integrated sandwich type capacitor.

In the claims the term buffer amplifier means is meant to include amplifiers, logic inverters, logic gates, bistable devices and other circuitry exhibiting relatively high signal gain.

What is claimed is:

1. Apparatus for generating a phase shifted clock signal comprising:
    a clock input terminal for applying a clock signal;
    a plurality of similar inverting amplifiers, each having input and output terminals, one of said amplifiers having its input terminal coupled to said clock input terminal, and the remaining amplifiers coupled in cascade with the one of said amplifiers wherein the output terminal of a preceding amplifier is coupled to the input terminal of a succeeding amplifier;
    a plurality of similar valued capacitances respectively coupled between the output terminals of each of said amplifiers and a point of substantially constant potential;
    signal selection means having a plurality of input terminals, and an output terminal for providing said phase shifted clock signal;
    a plurality of buffer amplifier means, each having an input terminal exhibiting an impedance, and having respective output terminals, said buffer amplifier means respectively coupled between respective input terminals of said signal selection means and the output terminals of every other one of said cascade connected amplifiers; and
    a plurality of circuit means, each having an input terminal exhibiting an impedance which substantially emulates the impedance exhibited by the respective input terminals of said buffer amplifier means, and the input terminals of said plurality of circuit means being coupled to respective output terminals of inverting amplifiers which are not coupled to said buffer amplifier means, for providing delayed representations of said clock signal.

2. The apparatus set forth in claim 1 wherein said plurality of similar valued capacitances are formed on an integrated circuit including a plurality of levels of conducting elements respectively separated by insulating layers, each capacitance formed of first and second plates, a first plate of each capacitance including a conducting element of a first of said plurality of levels and the second plate of each capacitance formed of conducting elements of two further levels of said plurality of levels, and wherein said first level is disposed between said two further levels.

3. The apparatus set forth in claim 1 wherein each of said circuit means of said plurality of circuit means are respectively similar to said buffer amplifier means.

4. The apparatus set forth in claim 1 wherein each of said inverting amplifiers comprises a complementary symmetry metal-oxide-semiconductor inverter circuit, each of said buffer amplifiers comprises a complementary symmetry metal-oxide-semiconductor inverter circuit, and each of said circuit means comprises a complementary symmetry metal-oxide-semiconductor inverter circuit.

5. The apparatus set forth in claim 1 wherein each of said plurality of circuit means has an output terminal, said apparatus further includes:
    a source of reference signal which exhibits periodic transitions;
    decoder means, having a plurality of input terminals respectively coupled to the output terminals of said circuit means, and a further terminal coupled to said source of reference signal, for generating a control signal indicating which of said circuit means provides a delayed representation of said clock signal exhibiting a signal transition most nearly coincident with a signal transition of said reference signal; and
    means for coupling said control signal to said signal selection means.

* * * * *